US012633339B2

(12) United States Patent
Dhori et al.

(10) Patent No.: US 12,633,339 B2
(45) Date of Patent: May 19, 2026

(54) IN-MEMORY COMPUTATION CIRCUIT USING STATIC RANDOM ACCESS MEMORY (SRAM) ARRAY SEGMENTATION AND LOCAL COMPUTE TILE READ BASED ON WEIGHTED CURRENT

(71) Applicant: STMicroelectronics International N.V., Geneva (CH)

(72) Inventors: Kedar Janardan Dhori, Ghaziabad (IN); Harsh Rawat, Faridabad (IN); Promod Kumar, Greater Noida (IN); Nitin Chawla, Noida (IN); Manuj Ayodhyawasi, Noida (IN)

(73) Assignee: STMicroelectronics International N.V., Geneva (CH)

( * ) Notice: Subject to any disclaimer, the term of this patent is extended or adjusted under 35 U.S.C. 154(b) by 310 days.

(21) Appl. No.: 18/136,507

(22) Filed: Apr. 19, 2023

(65) Prior Publication Data

US 2023/0386565 A1     Nov. 30, 2023

Related U.S. Application Data

(60) Provisional application No. 63/345,663, filed on May 25, 2022.

(51) Int. Cl.
G11C 11/419 (2006.01)
G11C 11/412 (2006.01)
(Continued)

(52) U.S. Cl.
CPC .......... G11C 11/419 (2013.01); G11C 11/412 (2013.01); G11C 11/418 (2013.01); H03M 1/742 (2013.01)

(58) Field of Classification Search
CPC ... G11C 11/419; G11C 11/412; G11C 11/418; G11C 11/54; G11C 7/1006; H03M 1/742; G06N 3/065
See application file for complete search history.

(56) References Cited

U.S. PATENT DOCUMENTS 5,132,931 A * 7/1992 Koker ...................... G11C 7/22
365/210.1
5,831,907 A * 11/1998 Trimberger ........... G11C 11/412
365/189.04
(Continued)

FOREIGN PATENT DOCUMENTS

CN        111144558 B      8/2020
CN        111816234 A      10/2020
DE    112019003066 T5      4/2021

OTHER PUBLICATIONS

B. Razavi, "The StrongARM Latch [A Circuit for All Seasons]," in IEEE Solid-State Circuits Magazine, vol. 7, No. 2, pp. 12-17, Spring 2015 (Year: 2015).*
(Continued)

*Primary Examiner* — Alfredo Bermudez Lozada
*Assistant Examiner* — James S Wells
(74) *Attorney, Agent, or Firm* — Crowe & Dunlevy LLC

(57)            ABSTRACT

An in-memory computation circuit includes a memory array including sub-arrays of with SRAM cells connected in rows by word lines and in columns by bit lines. A row controller circuit selectively actuates word lines across the sub-arrays for an in-memory compute operation. A computation tile circuit for each sub-array includes a column compute circuit for each bit line. Each column compute circuit includes a switched timing circuit that is actuated in response to weight data on the bit line for a duration of time set by an in-memory compute operation enable signal. A current digital-to-analog converter powered by the switched timing (Continued)

circuit operates to generate a drain current having a magnitude controlled by bits of feature data for the in-memory compute operation. The drain current is integrated to generate an output voltage.

19 Claims, 11 Drawing Sheets

(51) Int. Cl.
    *G11C 11/418*        (2006.01)
    *H03M 1/74*        (2006.01)

(56) References Cited

U.S. PATENT DOCUMENTS

| | | | | |
|---|---|---|---|---|
| 9,697,877 | B2 * | 7/2017 | Shanbhag | G11C 8/08 |
| 11,322,195 | B2 * | 5/2022 | Sinangil | H03M 1/802 |
| 2004/0095827 | A1 * | 5/2004 | Perner | G11C 11/16 |
| | | | | 365/209 |
| 2016/0232951 | A1 | 8/2016 | Shanghag et al. | |
| 2019/0042199 | A1 * | 2/2019 | Sumbul | G11C 8/10 |
| 2019/0102170 | A1 | 4/2019 | Chen et al. | |
| 2021/0089865 | A1 | 3/2021 | Wang et al. | |
| 2021/0096588 | A1 * | 4/2021 | Kong | G05F 3/08 |
| 2021/0397931 | A1 | 12/2021 | Hoang et al. | |
| 2022/0113941 | A1 * | 4/2022 | Zhang | G06F 17/16 |
| 2022/0276835 | A1 * | 9/2022 | Yang | G11C 11/412 |

OTHER PUBLICATIONS

Sun, Xiaoyu, et al: "Computing-in-Memory with SRAM and RRAM for Binary Neural Networks," 2018 IEEE, 4 pages.
Area-Efficient and Variation-Tolerant In-Memory BNN Computing using 6T SRAM Array , Symposium on Circuits VLSI 2019.
X-SRAM: Enabling In-Memory Boolean Computations in CMOS Static Random Access Memories , IEEE Transactions on Circuits and Systems-I: Regular Papers, vol. 65, No. 12, Dec. 2018.
M. Kang et al., "A Multi-Functional In-Memory Inference Processor Using a Standard 6T SRAM Array," IEEE Journal of Solid-State Circuits, vol. 53, No. 2, 2018.
J. Zhang et al., "In-memory computation of a machine-learning classifier in a standard 6T SRAM array," IEEE Journal of Solid-State Circuits, vol. 52, No. 4, 2017.
A. Biswas and A. P. Chandrakasan, "CONV-SRAM: An Energy-Efficient SRAM with In-Memory Dot-Product Computation for Low-Power Convolutional Neural Networks," IEEE Journal of Solid-State Circuits (JSSC), vol. 54, No. 1, 2019.
X. Si et al., "A 28nm 64Kb 6T SRAM Computing-in-Memory Macro with 8b MAC Operation for AI Edge Chips," IEEE International Solid-State Circuits Conference (ISSCC), 2020.
J.-W. Su et al., "A 28nm 64Kb Inference-Training Two-Way Transpose Multibit 6T SRAM Compute-in-Memory Macro for AI Edge Chips," IEEE International Solid-State Circuits Conference (ISSCC), 2020.
S. Yin et al., "XNOR-SRAM: In-Memory Computing SRAM Macro for Binary/Ternary Deep Neural Networks," IEEE Journal of Solid-State Circuits (JSSC), vol. 55, No. 6, 2020.
H. Jia et al., "A Programmable Heterogeneous Microprocessor Based on Bit-Scalable In-Memory Computing," in IEEE Journal of Solid-State Circuits, vol. 55, No. 9, 2020.
Z. Jiang et al., "C3SRAM: An In-Memory-Computing SRAM Macro Based on Robust Capacitive Coupling Computing Mechanism," IEEE Journal of Solid-State Circuits (JSSC), vol. 55, No. 7, 2020.
H. Valaviet al., "A 64-Tile 2.4-Mb In-Memory-Computing CNN Accelerator Employing Charge-Domain Compute," IEEE Journal of Solid-State Circuits, vol. 54, No. 6, 2019.
Q. Dong , "A 351TOPS/W and 372.4GOPS Compute-in-Memory SRAM Macro in 7nm FinFET CMOS for Machine-Learning Applications," IEEE International Solid-State Circuits Conference (ISSCC), 2020.
X. Si , "24.5 A Twin-8T SRAM Computation-In-Memory Macro for Multiple-Bit CNN-Based Machine Learning," IEEE International Solid-State Circuits Conference (ISSCC), 2019.
EPO Search Report and Written Opinion for counterpart EP Appl. No. 23174864.1, report dated Nov. 30, 2023, 8 pgs.

* cited by examiner

BL<0>

222<0>

Vdd

224

M1

...

226

BL<M-1>

222<M-1>

Vdd

En

Vset(0)

I-DAC

...

$I_d$

220

Vset(M-1)

I-DAC $I_d$

Feature Data<_>

121

228

S<0>

Cint

Vglobal

230

ADC

232

Decision<_>

226

I-DAC

Vdd

FD<_><1>

Md

Vset<1>

Vset<3>

Mf

Mb

Vdd

FD<_><0>

Mc

Vset<0>

Vset<2>

Me

Ma $I_d$

228

IN-MEMORY COMPUTATION CIRCUIT USING STATIC RANDOM ACCESS MEMORY (SRAM) ARRAY SEGMENTATION AND LOCAL COMPUTE TILE READ BASED ON WEIGHTED CURRENT

CROSS REFERENCE TO RELATED APPLICATIONS

This application claims priority from United States Provisional Application for Patent No. 63/345,663, filed May 25, 2022, the disclosure of which is incorporated by reference.

TECHNICAL FIELD

Embodiments relate to an in-memory computation circuit utilizing a static random access memory (SRAM) array and, in particular, to a segmented architecture of the array with a local compute read based on weighted current.

BACKGROUND

Reference is made to FIG. 1 which shows a schematic diagram of an in-memory computation circuit 10. The circuit 10 utilizes a static random access memory (SRAM) array 12 formed by standard 6T SRAM memory cells 14 arranged in a matrix format having N rows and M columns. As an alternative, a standard 8T memory cell or an SRAM with a similar functionality and topology could instead be used. Each memory cell 14 is programmed to store a bit of a computational weight or kernel data for an in-memory compute operation. In this context, the in-memory compute operation is understood to be a form of a high dimensional Matrix Vector Multiplication (MVM) supporting multi-bit weights that are stored in multiple bit cells of the memory. The group of bit cells (in the case of a multibit weight) can be considered as a virtual synaptic element. Each bit of the computational weight has either a logic "1" or a logic "0" value.

Each SRAM cell 14 includes a word line WL and a pair of complementary bit lines BLT and BLC. The 8T-type SRAM cell would additionally include a read word line RWL and a read bit line BLR. The cells 14 in a common row of the matrix are connected to each other through a common word line WL (and through the common read word line RWL in the 8T-type implementation). The cells 14 in a common column of the matrix are connected to each other through a common pair of complementary bit lines BLT and BLC (and through the common read bit line BLR in the 8T-type implementation). Each word line WL, RWL is driven by a word line driver circuit 16 which may be implemented as a CMOS driver circuit (for example, a series connected p-channel and n-channel MOSFET transistor pair forming a logic inverter circuit). The word line signals applied to the word lines, and driven by the word line driver circuits 16, are generated from feature data input to the in-memory computation circuit 10 and controlled by a row controller circuit 18. A column processing circuit 20 senses the analog current signals on the pairs of complementary bit lines BLT and BLC (and/or on the read bit line BLR) for the M columns and generates a decision output for the in-memory compute operation from those analog current signals. The column processing circuit 20 can be implemented to support processing where the analog current signals on the columns are first processed individually and then followed by a recombination of multiple column outputs.

Although not explicitly shown in FIG. 1, it will be understood that the circuit 10 further includes conventional row decode, column decode, and read-write circuits known to those skilled in the art for use in connection with writing bits of the computational weight to, and reading bits of the computational weight from, the SRAM cells 14 of the memory array 12. With reference now to FIG. 2, each memory cell 14 includes two cross-coupled CMOS inverters 22 and 24, each inverter including a series connected p-channel and n-channel MOSFET transistor pair. The inputs and outputs of the inverters 22 and 24 are coupled to form a latch circuit having a true data storage node QT and a complement data storage node QC which store complementary logic states of the stored data bit. The cell 14 further includes two transfer (passgate) transistors 26 and 28 whose gate terminals are driven by a word line WL. The source-drain path of transistor 26 is connected between the true data storage node QT and a node associated with a true bit line BLT. The source-drain path of transistor 28 is connected between the complement data storage node QC and a node associated with a complement bit line BLC. The source terminals of the p-channel transistors 30 and 32 in each inverter 22 and 24 are coupled to receive a high supply voltage (for example, Vdd) at a high supply node, while the source terminals of the n-channel transistors 34 and 36 in each inverter 22 and 24 are coupled to receive a low supply voltage (for example, ground (Gnd) reference) at a low supply node. While FIG. 2 is specific to the use of 6T-type cells, those skilled in the art recognize that the 8T-type cell is similarly configured and would further include a signal path that is coupled to one of the storage nodes and includes a transfer (passgate) transistor coupled to the read bit line BLR and gate driven by the signal on the read word line RWL. The word line driver circuit 16 is also typically coupled to receive the high supply voltage (Vdd) at the high supply node and is referenced to the low supply voltage (Gnd) at the low supply node.

The row controller circuit 18 receives the feature data for the in-memory compute operation and in response thereto performs the function of selecting which ones of the word lines WL<0> to WL<N–1> are to be simultaneously accessed (or actuated) in parallel during an in-memory compute operation, and further functions to control application of pulsed signals to the word lines in accordance with that in-memory compute operation. FIG. 1 illustrates, by way of example only, the simultaneous actuation of all N word lines with the pulsed word line signals, it being understood that in-memory compute operations may instead utilize a simultaneous actuation of fewer than all rows of the SRAM array. The analog signals on a given pair of complementary bit lines BLT and BLC (or on the read bit line RBL in the 8T-type implementation) are dependent on the logic state of the bits of the computational weight stored in the memory cells 14 of the corresponding column and the width(s) of the pulsed word line signals applied to those memory cells 14.

The implementation illustrated in FIG. 1 shows an example in the form of a pulse width modulation (PWM) for the applied word line signals for the in-memory compute operation dependent on the received feature data. The use of PWM or period pulse modulation (PTM) for the applied word line signals is a common technique used for the in-memory compute operation based on the linearity of the vector for the multiply-accumulation (MAC) operation. The pulsed word line signal format can be further evolved as an encoded pulse train to manage block sparsity of the feature data of the in-memory compute operation. It is accordingly recognized that an arbitrary set of encoding schemes for the applied word line signals can be used when simultaneously driving multiple word lines. Furthermore, in a simpler implementation, it will be understood that all applied word line signals in the simultaneous actuation may instead have a same pulse width.

FIG. 3 is a timing diagram showing simultaneous application of the example pulse width modulated word line signals to plural rows of memory cells 14 in the SRAM array 12 for a given in-memory compute operation, and the development over time of voltages Va,T and Va,C on one corresponding pair of complementary bit lines BLT and BLC, respectively, in response to sinking of cell read current due to the pulse width(s) of those word line signals and the logic state of the bits of the computational weight stored in the memory cells 14. The representation of the voltage Va levels as shown is just an example. After completion of the computation cycle of the in-memory compute operation, the voltage Va levels return to the bit line precharge Vdd level. It will be noted that a risk exists that the voltage on at least one of the bit lines BLT and BLC may fall from the Vdd voltage to a level below the write margin where an unwanted data flip occurs with respect to the stored data bit value in one of the memory cells 14 of the column. For example, a logic "1" state stored in the cell 14 of a column may be flipped to a logic "0" state. This data flip introduces a data error in the computational weight stored in the memory cells, thus jeopardizing the accuracy of subsequent in-memory compute operations.

The unwanted data flip that occurs due to an excess of bit line voltage lowering is mainly an effect of the simultaneous parallel access of the word lines in matrix vector multiplication mode during the in-memory compute operation. This problem is different from normal data flip of an SRAM bit cell due to Static-Noise-Margin (SNM) issues which happens in serial bit cell access when the bit line is close to the level of the supply voltage Vdd. During serial access, the normal data flip is instead caused by a ground bounce of the data storage nodes QT or QC.

SUMMARY

In an embodiment, an in-memory computation circuit comprises: a memory array including a plurality of sub-arrays, wherein each sub-array includes static random access memory (SRAM) cells arranged in a matrix with plural rows and plural columns, each row including a word line connected to the SRAM cells of the row, and each column including a bit line connected to the SRAM cells of the column, said SRAM cells storing bits of weight data for an in-memory compute operation; a word line driver circuit for each row having an output connected to drive the word line of the row; and a row controller circuit configured to simultaneously actuate at least one word line for each sub-array by applying pulses through the word line driver circuits to the word lines for the in-memory compute operation.

A computation tile circuit for each sub-array includes a plurality of column compute circuits coupled to the bit lines, respectively, of the columns of the sub-array. Each column compute circuit comprises: a switched timing circuit that is actuated in response to a first logic state of the weight data on the bit line for a duration of time set by an enable signal for the in-memory compute operation; a current digital-to-analog converter (I-DAC) powered by actuation of the switched timing circuit and configured to generate a drain current having a magnitude controlled by bits of feature data for the in-memory compute operation; and an integration circuit configured to integrate the drain current and generate an output voltage.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 2:
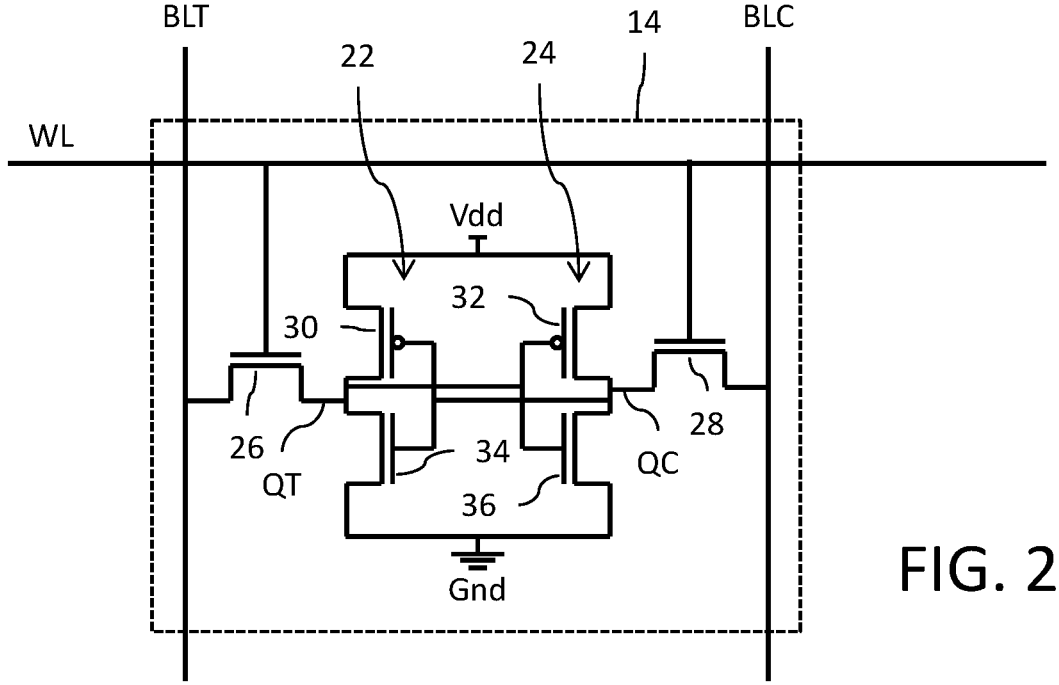
FIG. 2 is a circuit diagram of a standard 6T static random access memory (SRAM) cell as used the memory array of the in-memory computation circuit shown in FIG. 1.
Figure 3:
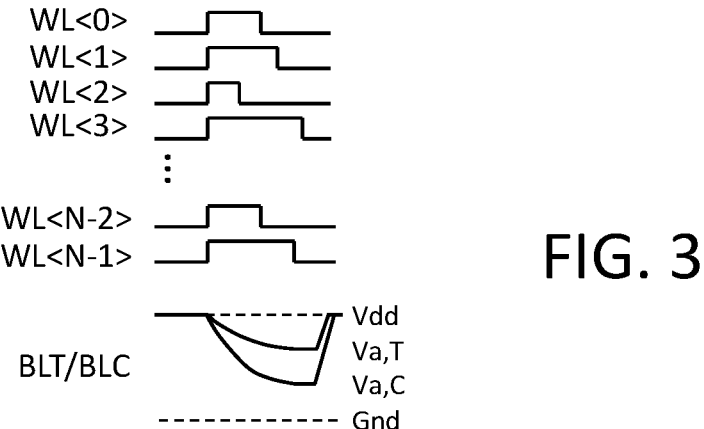
FIG. 3 is a timing diagram illustrating an in-memory compute operation.
Figure 4:
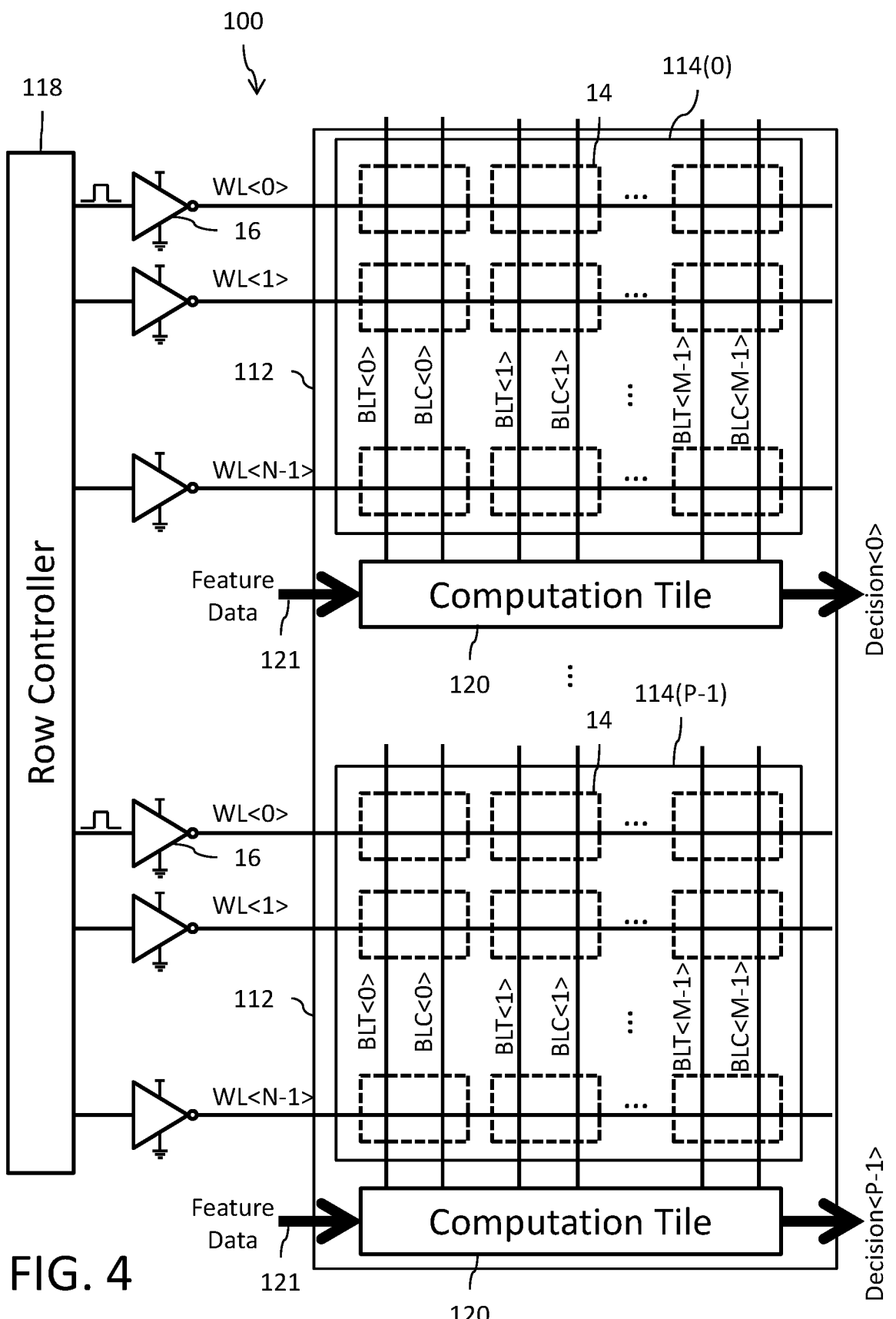
FIG. 4 is a schematic diagram of an in-memory computation circuit.

Reference is now made to FIG. 4 which shows a schematic diagram of an in-memory computation circuit 100. The circuit 100 utilizes a static random access memory (SRAM) array 112 that is segmented (i.e., partitioned) into a plurality of sub-arrays 114. In this example, there are P sub-arrays 114(0) to 114(P−1) within the array 112. Each sub-array 114(i), where i is the sub-array index from 0 to P−1, includes standard 6T SRAM memory cells 14 (see, FIG. 2) arranged in a matrix format having N rows and M columns. As an alternative, a standard 8T memory cell or an SRAM with a similar functionality and topology could instead be used. Each memory cell 14 is programmed to store a bit of a computational weight or kernel data for an in-memory compute operation. Each bit of the computational weight has either a logic "1" or a logic "0" value.

Each SRAM cell 14 includes a word line WL and a pair of complementary bit lines BLT and BLC. The 8T-type SRAM cell would additionally include a read word line RWL and a read bit line BLR. The cells 14 in a common row of each sub-array 114 are connected to each other through a common word line WL (and through the common read word line RWL in the 8T-type implementation). The cells 14 in a common column of each sub-array 114 are connected to each other through a common pair of complementary bit lines BLT and BLC (and through the common read bit line BLR in the 8T-type implementation). In the illustrated example, for a given sub-array 114(i) there is a true bit line $BLT_i<j>$, where j is a column index from 0 to M−1, coupled to the j-th column of memory cells 14, and there is a complement bit line $BLC_i<j>$ coupled to that same j-th column of memory cells 14. Each word line WL, RWL is driven by a word line driver circuit 16 which may be implemented as a CMOS driver circuit (for example, a series connected p-channel and n-channel MOSFET transistor pair forming a logic inverter circuit). In the illustrated example, for a given sub-array 114(*i*), there is a word line WL<k>, where k is a row index from 0 to N−1, coupled to the k-th row of memory cells 14.

The word line signals applied to the word lines, and driven by the word line driver circuits 16, are generated from feature data input to the in-memory computation circuit 100 and controlled by a row controller circuit 118. In response to the feature data, the row controller circuit 118 selects the word line WL for one row at a time in each sub-array 114 in connection with the execution of a given in-memory compute operation and applies a pulsed word line signal to that selected word line. The pulsed word line signals on the asserted individual word lines in the different sub-arrays 114 have a fixed pulse width. In a preferred embodiment, the width of the word line signal pulse is selected so that a full swing on the bit line BL is achieved when reading the bit of the weight data from the memory cell 14 (i.e., one of the complementary bit lines BLT or BLC will be fully discharge). Thus, in response to the assertion of the word line signal, and as a function of the logic state of the weight bit stored in the accessed memory cell 14, local bit line voltages VL develop on the complementary bit lines BLT and BLC.

FIG. 4 illustrates an example where the first word lines WL<0> in each of the plurality of sub-arrays 114 are being simultaneously driven by fixed pulse width word line signals through the word line driver circuits 16 in response to the feature data for the in-memory compute operation. In an embodiment, the row controller circuit 118 may sequentially select each of the word lines WL<0> through WL<N−1> in connection with executing the in-memory compute operation. In any case, it is preferable that only one word line (not necessarily the same word line) at a time per sub-array 114 be asserted in order to minimize the risk of inadvertent bit flip within each sub-array 114 during the in-memory compute operation.

Figure 1:
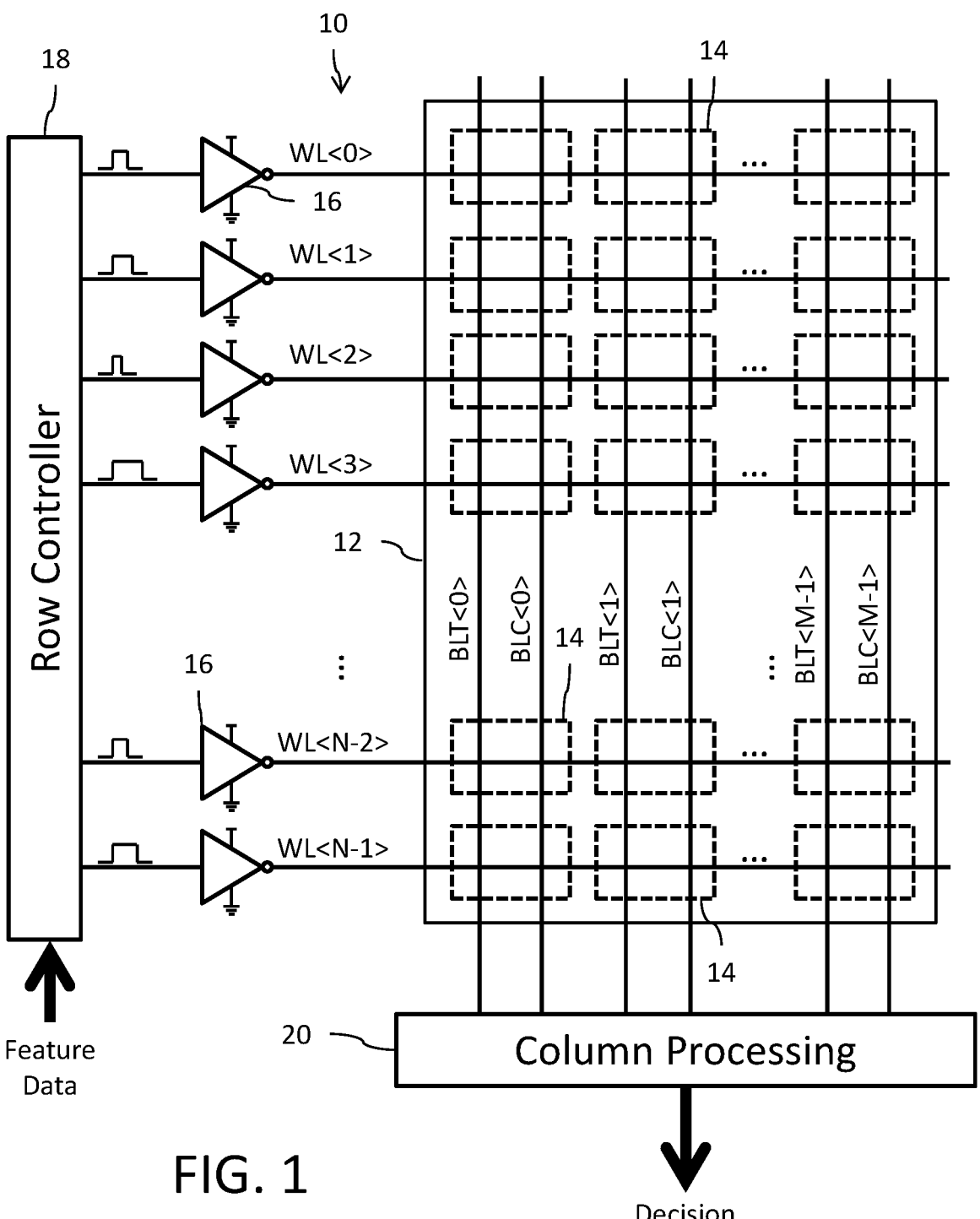
FIG. 1 is a schematic diagram of an in-memory computation circuit.

A computation tile circuit 120 for each sub-array 114 receives the logic state on one of the complementary bit lines BLT and BLC (and/or on the read bit line BLR) for each of the M columns. That bit line logic state corresponds to the logic state of the weight data stored in the memory cell 14 which is accessed by the asserted word line signal pulse. The width of the word line signal pulse is selected so that a full swing on the bit line is achieved when reading the bit of the weight data from the memory cell 14. The computation tile circuit 120 further receives bit(s) of the feature data for the in-memory compute operation over a feature data bus 121. Note here that this is different from the implementation of FIG. 1 where the bits of the feature data are instead input to the row controller for controlling the generation of the pulse width modulated word line signals. A current digital-to-analog converter (I-DAC) circuit converts the digital feature data to an analog drain current $I_d$ having a magnitude modulated by the bit(s) of the feature data and that drain current $I_d$ is integrated as a function of the sensed logic state of the memory cell 14 to generate a column output voltage. The column output voltages generated by the computation tile circuit 120 are then averaged and that averaged voltage is sampled for conversion by an analog-to-digital converter (ADC) circuit to produce a digital decision output from the computation tile circuit 120. The in-memory compute operation being performed is essentially a dot-product operation of the feature data and the weight data. The decision outputs Decision<0> through Decision<P−1> may be individually used or further combined in a subsequent digital signal processing (DSP) operation.

Although not explicitly shown in FIG. 4, it will be understood that the circuit 100 further includes conventional row decode, column decode, and read-write circuits known to those skilled in the art for use in connection with writing bits of the computational weight to, and reading bits of the computational weight from, the SRAM cells 14 of each sub-array 114 within the memory array 112.

Figures 5, 6A:
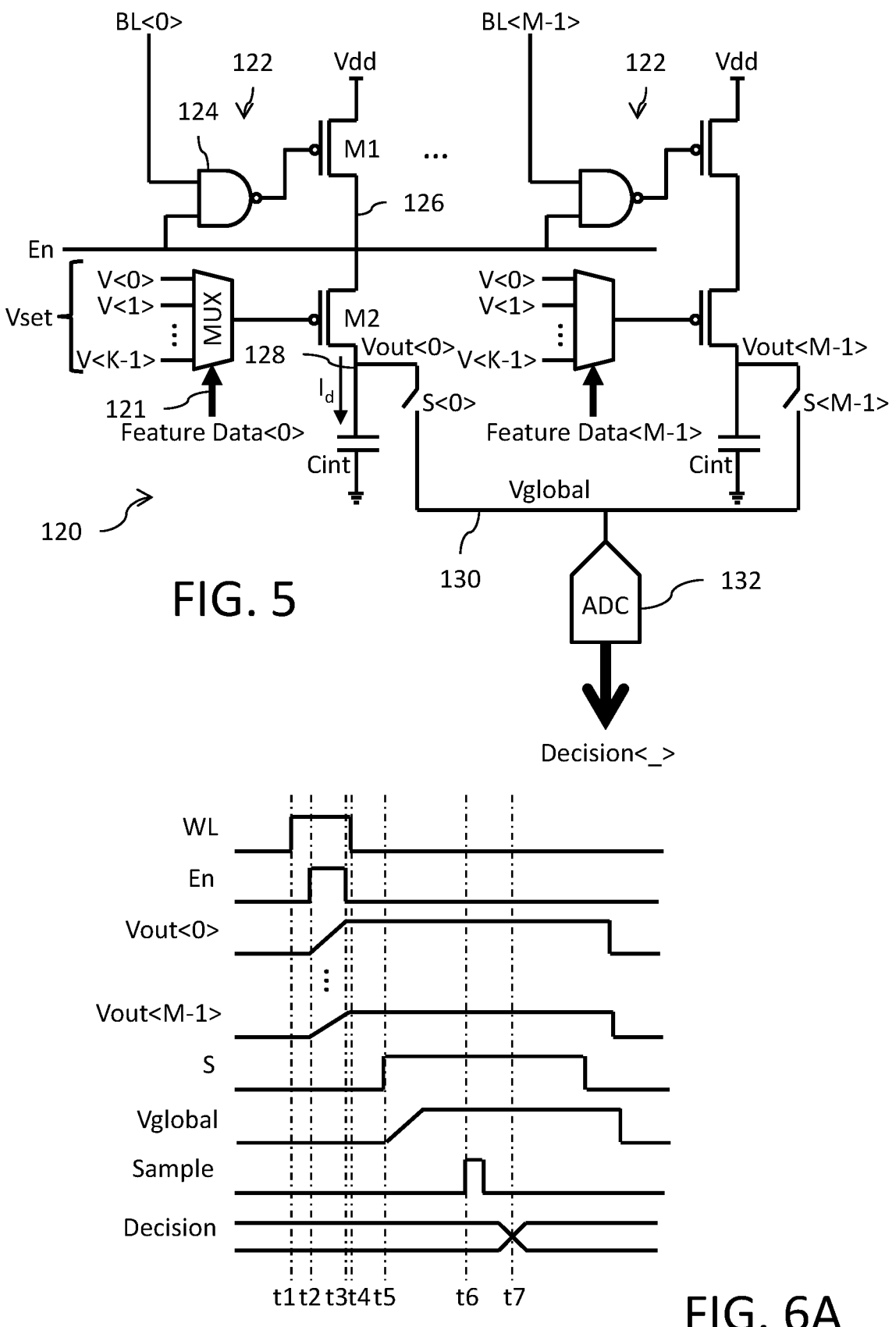
FIG. 5 is a circuit diagram for an embodiment of a computation tile used in the circuit of FIG. 4.
FIGS. 6A, 6B and 6C are timing diagrams illustrating operation of the FIG. 5 circuit.

Reference is now made to FIG. 5 which illustrates a circuit diagram for an embodiment of the computation tile circuit 120. The computation tile circuit 120 includes a plurality of column compute circuits 122, with each circuit 122 connected to the bit line BL (either BLT or BLC) of a corresponding column of the sub-array 114. Each column compute circuit 122 includes a combinational logic circuit 124 configured to logically combine the weight data bit on the bit line BL (i.e., read from the accessed memory cell 14) with an enable signal En. In this embodiment, the combinational logic circuit 124 is formed by a logic NAND gate. The output of the combinational logic circuit 124 is a gate control signal that is asserted (in this case logic low) when both the weight data bit and the enable signal En are logic high.

The enable signal En is asserted logic high when the in-memory compute operation is being executed, and the width of the enable signal En pulse corresponds to an integration time period for the in-memory compute operation with a timing generally corresponding to when the word line signal pulses are being generated. The output of the combinational logic circuit 124 drives the gate of a p-channel MOS transistor M1 having a source coupled, preferably directly connected, to a supply voltage node Vdd and a drain coupled, preferably directly connected to an intermediate node 126. The transistor M1 is configured to function as a switching circuit. The combinational logic circuit 124 and transistor M1 thus form a switched timing circuit where transistor M1 is turned on, if the bit line BL is at logic 1, to provide the supply voltage Vdd at intermediate node 126 for a duration of time equal to the width of the enable signal En.

The column compute circuit 122 further includes a p-channel MOS transistor M2 having a source coupled, preferably directly connected, to the intermediate node 126 and a drain coupled, preferably directly connected, to an output node 128. An integration capacitor Cint has a first terminal coupled, preferably directly connected, to the output node 128 and a second terminal coupled, preferably directly connected, to a reference voltage node (for example, ground). Although not specifically illustrated, it will be understood that suitable circuitry for discharging (i.e., resetting) the capacitor Cint as necessary is provided. The gate of transistor M2 is driven by a voltage generated at the output of a K:1 multiplexer circuit MUX. The K inputs of the multiplexer circuit MUX receive a set (Vset) of analog voltages V<0> to V<K−1>. The selection input of the multiplexer circuit MUX receives J bits of the feature data (where K=2') from the feature data bus 121. The multiplexer circuit MUX decodes the J bits of the feature data to select one of the K analog voltages of Vset for application to the gate of transistor M2. The transconductance of the transistor M2 converts the level of the analog voltage at the gate to output a drain current $I_d$ that is sourced to the output node 128 when, as controlled by the switched timing circuit, both the weight data bit and the enable signal En are logic high. The magnitude of the drain current $I_d$ is modulated as a function of the decoded J bits of the feature data and the selected analog voltage V. The integration capacitor Cint integrates this drain current $I_d$ to generate the column output voltage Vout at the output node 128. The multiplexer circuit MUX and transistor M2 thus form a current digital-to-analog converter (I-DAC) circuit that is selectively powered for actuation by the switched timing circuit and having an output current $I_d$ whose magnitude is modulated as a function of the bit(s) of the feature data.

The output nodes 128 of the column compute circuits 122<0> to 122<M−1> are selectively connected through switches S<0> to S<M−1>, respectively, to a global output line 130 that is coupled, preferably directly connected, to the input of an analog-to-digital converter (ADC) circuit 132. In this example implementation of the computation tile circuit 120, the global output line 130 extends parallel to the row direction of the sub-array 114 (although in other implementations the global output line 130 could connect to column compute circuits along columns of the array 112). The ADC circuit 132 functions to sample and convert the voltage Vglobal on the global output line 130 to generate the digital decision output for the computation tile circuit 120. The switches S<0> to S<M−1> are simultaneously actuated for the in-memory compute operation and the voltage Vglobal on the global output line 130 at the input of the ADC circuit 132 is the average of the output voltages Vout<0> to Vout<M−1>.

The combinational logic circuit 124, MOS transistors M1 and M2 and multiplexer MUX form a switched current digital-to-analog converter (I-DAC) circuit where the output drain current $I_d$ has a magnitude generated as a function of the product of the weight bit and the feature data (in other words, having a magnitude that is modulated as a function of the bit(s) of the feature data), and which has a duration of time that is dependent on the enable signal En. The integration time for the generated drain current $I_d$ is controlled by the width of the enable signal En pulse.

The following table illustrates operation of each column compute circuit 122 in an example with a single bit weight and two bit feature data:

| Feature Data | | Weight | Vgate | Drain Current | Output Voltage |
|---|---|---|---|---|---|
| 1 | 1 | 1 | V<3> | 3*Iref | 3*ΔV |
| 1 | 0 | | V<2> | 2*Iref | 2*ΔV |
| 0 | 1 | | V<1> | 1*Iref | 1*ΔV |
| 0 | 0 | | V<0> | 0 | 0 |
| 1 | 1 | 0 | V<3> | 0 | 0 |
| 1 | 0 | | V<2> | 0 | 0 |
| 0 | 1 | | V<1> | 0 | 0 |
| 0 | 0 | | V<0> | 0 | 0 |

Those skilled in the art will recognize that the foregoing can be extended to any desired number of bits for the feature data.

Operation of the I-DAC circuit is as follows: Assume first that the weight bit on the bit line BL is logic 0. In this case, the combinational logic circuit 124 will output a logic 1 for application to the transistor M1. As a result, transistor M1 is turned off, no power is provided to the transistor M2 and the drain current $I_d$ output will be zero. It will be noted from the previous table that when the weight bit is logic 0 there is no drain current output and the integrated change in voltage on the capacitor Cint is zero.

Next, assume that the weight bit on the bit line is logic 1. In this case, the combinational logic circuit 124 will output a logic 0 for application to the transistor M1 for a duration of time controlled by the pulse width of the enable signal En. As a result, transistor M1 is turned on and power is provided to the transistor M2.

Now, assume that both bits of the two bit feature data (Feature Data<_> <1:0>) are logic 0. In this case, the multiplexer MUX decodes bits <0,0> of the feature data and selects the voltage V<0> for application to the gate of transistor M2. The transconductance of transistor M2 converts the voltage V<0> to a drain current $I_d$ having a zero magnitude. It will be noted from the previous table that when the weight bit is logic 1 and both feature data bits are logic 0 there is no drain current output and the integrated change in voltage on the capacitor Cint is zero.

Now, assume that the less significant bit of the two bit feature data (Feature Data<_> <1:0>) is logic 1 and the more significant bit of the two bit feature data (Feature Data<_> <1:0>) is logic 0. In this case, the multiplexer MUX decodes bits <0,1> of the feature data and selects the voltage V<1> for application to the gate of transistor M2. The transconductance of transistor M2 converts the voltage V<1> to a drain current $I_d$ having a first magnitude (1*Iref). It will be noted from the previous table that when the weight bit is logic 1 and the feature data bits are <0,1> there is a drain current $I_d$=1*Iref output and the change in voltage on the capacitor Cint due to the integration of current $I_d$ over the pulse width of the enable signal En is 1*ΔV.

Now, assume that the more significant bit of the two bit feature data (Feature Data<_> <1:0>) is logic 1 and the less significant bit of the two bit feature data (Feature Data<_> <1:0>) is logic 0. In this case, the multiplexer MUX decodes bits <1,0> of the feature data and selects the voltage V<2> for application to the gate of transistor M2. The transconductance of transistor M2 converts the voltage V<2> to a drain current $I_d$ having a second magnitude (2*Iref). It will be noted from the previous table that when the weight bit is logic 1 and the feature data bits are <1,0> there is a drain current Id=2*Iref output and the change in voltage on the capacitor Cint due to the integration of current $I_d$ over the pulse width of the enable signal En is 2*ΔV.

Now, assume that both bits of the two bit feature data (Feature Data<_> <1:0>) are logic 1. In this case, the multiplexer MUX decodes bits <1,1> of the feature data and selects the voltage V<3> for application to the gate of transistor M2. The transconductance of transistor M2 converts the voltage V<3> to a drain current $I_d$ having a third magnitude (3*Iref). It will be noted from the previous table that when the weight bit is logic 1 and both feature data bits are <1,1> there is a drain current $I_d$=3*Iref output and the change in voltage on the capacitor Cint due to the integration of current $I_d$ over the pulse width of the enable signal En is 3*ΔV.

FIG. 6A illustrates a timing diagram for the in-memory compute operation for the case where the weight data is single bit data. At time t1, the selected word line WL in each of the sub-arrays 114 is asserted. The voltage on the bit line BL then responds to the logic state of the stored bit in the memory cell 14. At time t2, the enable signal En is asserted and the drain current $I_d$ dependent on the decoded feature data is integrated by the integration capacitor to generate the output voltage Vout. At time t3, the enable signal En is deasserted and the integration time period ends. At time t4, the selected word line WL is deasserted. It will be noted that time t4 may, in some cases, precede time t3 depending on the desired pulse width for the enable signal En. At time t5, the switches S<0> to S<M−1> are closed and the voltage Vglobal on the global output line 130 develops from the average of the column output voltages Vout<0> to Vout<M−

1>. At time t6, the sampling circuit of the ADC converter circuit 132 is actuated to sample the voltage Vglobal on the global output line 130 for conversion and output of the decision output Decision at time t7. The output voltages Vout and the global voltage Vglobal are all reset.

The computation tile circuit 120 can also be used when the weight data is multi-bit. In such a case, the multiple bits (i.e., N bits) of the weight data are stored in the corresponding N memory cells 14 of each column in the sub-array 114 (where the least significant bit of the multi-bit weight data is stored in the memory cell 14 for the row with word line WL<0> and the most significant bit of the multi-bit weight data is stored in the memory cell 14 for the row with word line WL<N−1>). The row controller circuit 118 sequentially selects the word lines WL<0> through WL<N−1> for execution of the in-memory compute operation. With each word line selection, the enable signal En is also asserted. However, the pulse width of the enable signal En is binary weighted corresponding to the significance of the bit of the multi-bit weight data. As an example, the pulse width of the enable signal En increases with each successive word line selection (so that, for example, the pulse width of the enable signal when word line WL<1> is asserted is twice as long as the pulse width of the enable signal En when word line WL<0> is asserted, and the pulse width of the enable signal when word line WL<2> is asserted is twice as long as the pulse width of the enable signal En when word line WL<1> is asserted, etc.).

Figure 6B:
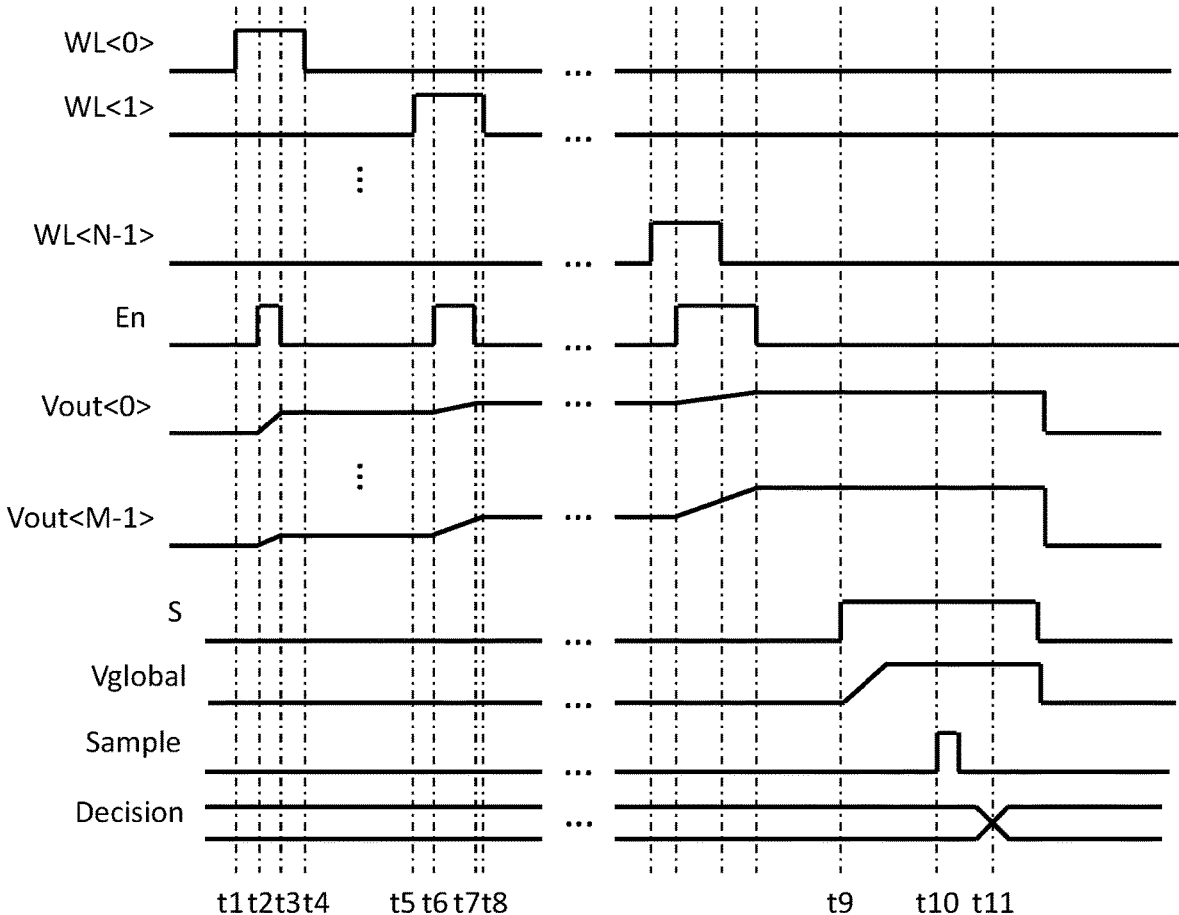

FIG. 6B illustrates a timing diagram for the in-memory compute operation for the case where the weight data is multi-bit data. At time t1, the first word line WL<0> in each of the sub-arrays 114 is selected and asserted. The voltage on the bit line BL then responds to the logic state of the stored least significant bit in the memory cell 14. At time t2, the enable signal En is asserted with a first pulse width and the drain current $I_d$ dependent on the decoded feature data is integrated by the integration capacitor to generate the output voltage Vout. At time t3, the enable signal En is deasserted and the integration time period for the least significant bit ends. At time t4, the first word line WL<0> is deasserted. It will be noted that time t4 may, in some cases, precede time t3 depending on the desired pulse width for the enable signal En. At time t5, the second word line WL<1> in each of the sub-arrays 114 is selected and asserted. The voltage on the bit line BL then responds to the logic state of the stored bit in the memory cell 14. At time t6, the enable signal En is asserted with a second pulse width (twice as long as the first pulse width) and the drain current $I_d$ dependent on the decoded feature data is integrated by the integration capacitor to further develop the output voltage Vout. At time t7, the enable signal En is deasserted and the integration time period for this bit ends. At time t8, the second word line WL<2> is deasserted. It will be noted that time t8 may, in some cases, precede time t7 depending on the desired pulse width for the enable signal En. The foregoing repeats through the assertion of the last word line WL(N−1) for the most significant bit and the assertion of the enable signal En with a pulse width that is $2^N$ times as long as the first pulse width. At time t9, the switches S<0> to S<M−1> are closed and the voltage Vglobal on the global output line 130 develops from the average of the column output voltages Vout<0> to Vout<M−1>. At time t10, the sampling circuit of the ADC converter circuit 132 is actuated to sample the voltage Vglobal on the global output line 130 for conversion and output of the decision output Decision at time t11. The output voltages Vout and the global voltage Vglobal are all reset.

In an alternative implementation for the computation tile circuit 120 to process multi-bit weight data, the multiple bits (i.e., N bits) of the weight data are again stored in the corresponding N memory cells 14 of each column in the sub-array 114. The row controller circuit 118 sequentially selects the word lines WL<0> through WL<N−1> for execution of the in-memory compute operation. With each word line selection, the enable signal En is also asserted. Unlike the FIG. 6B example, the pulse width of the enable signal En is constant for all assertions. In this case, the developed global output voltage is sampled and converted to a digital signal representing a partial sum for each asserted pair of word line pulse and enable signals. Following the processing associated with the last word line WL<N−1> and the determination of its associated partial sum, the digital signal processing function adds all the calculated partial sums produced by the ADC circuit to produce the digital output Decision.

Figure 6C:
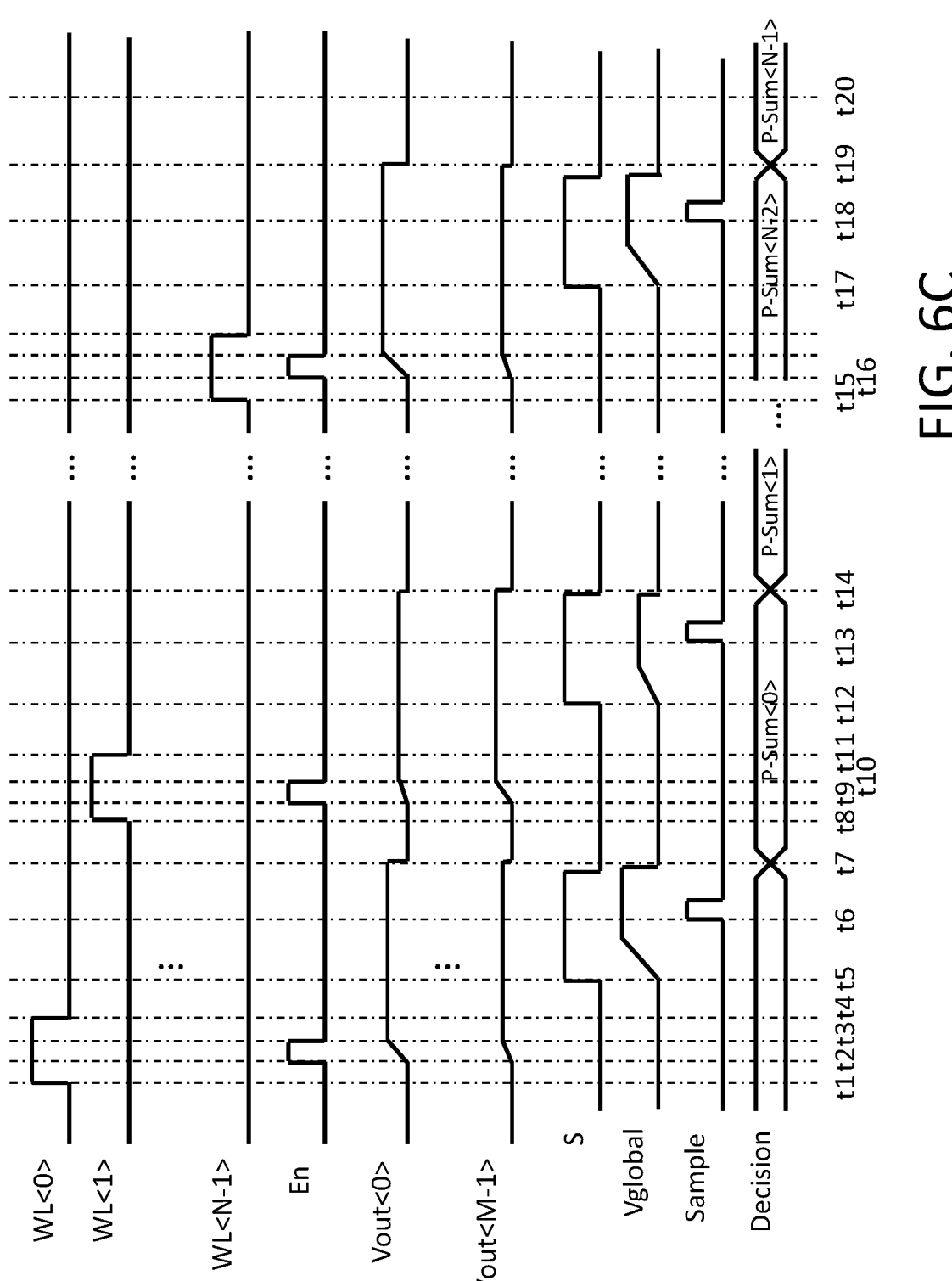

FIG. 6C illustrates a timing diagram for the in-memory compute operation for the case where the weight data is multi-bit data. At time t1, the first word line WL<0> in each of the sub-arrays 114 is selected and asserted. The voltage on the bit line BL then responds to the logic state of the stored least significant bit in the memory cell 14. At time t2, enable signal En is asserted and the drain current $I_d$ dependent on the decoded feature data is integrated by the integration capacitor to generate the output voltage Vout. At time t3, the enable signal En is deasserted and the integration time period for the least significant bit ends. At time t4, the first word line WL<0> is deasserted. It will be noted that time t4 may, in some cases, precede time t3 depending on the desired pulse width for the enable signal En. At time t5, the switches S<0> to S<M−1> are closed and the voltage Vglobal on the global output line 130 develops from the average of the column output voltages Vout<0> to Vout<M−1>. At time t6, the sampling circuit of the ADC converter circuit 132 is actuated to sample the voltage Vglobal on the global output line 130 for conversion and output of a first partial sum (P-Sum<0>) at time t7. The output voltages Vout and the global voltage Vglobal are all reset.

At time t8, the second word line WL<1> in each of the sub-arrays 114 is selected and asserted. The voltage on the bit line BL then responds to the logic state of the stored least significant bit in the memory cell 14. At time t9, the enable signal En is asserted and the drain current $I_d$ dependent on the decoded feature data is integrated by the integration capacitor to generate the output voltage Vout. At time t10, the enable signal En is deasserted and the integration time period for this bit ends. At time t11, the second word line WL<1> is deasserted. It will be noted that time t11 may, in some cases, precede time t10 depending on the desired pulse width for the enable signal En. At time t12, the switches S<0> to S<M−1> are closed and the voltage Vglobal on the global output line 130 develops from the average of the column output voltages Vout<0> to Vout<M−1>. At time t13, the sampling circuit of the ADC converter circuit 132 is actuated to sample the voltage Vglobal on the global output line 130 for conversion and output of a second partial sum (P-Sum<1>) at time t14. The output voltages Vout and the global voltage Vglobal are all reset.

The foregoing repeats through the assertion of the last word line WL(N−1) for the most significant bit (at time t15) and the assertion of the enable signal En (at time t16). At time t17, the switches S<0> to S<M−1> are closed and the voltage Vglobal on the global output line 130 develops from the average of the column output voltages Vout<0> to Vout<M−1>. At time t18, the sampling circuit of the ADC converter circuit 132 is actuated to sample the voltage Vglobal on the global output line 130 for conversion and output of a last partial sum (P-Sum<N−1>) at time t19. The output voltages Vout and the global voltage Vglobal are all reset.

Once all of the partial sums P-Sum<0> to P-Sum<N−1> have been determined (and saved in memory of the ADC circuit or the DSP circuit), a digital signal processing function can add the partial sums at time t20 and output the Decision.

Figure 7:
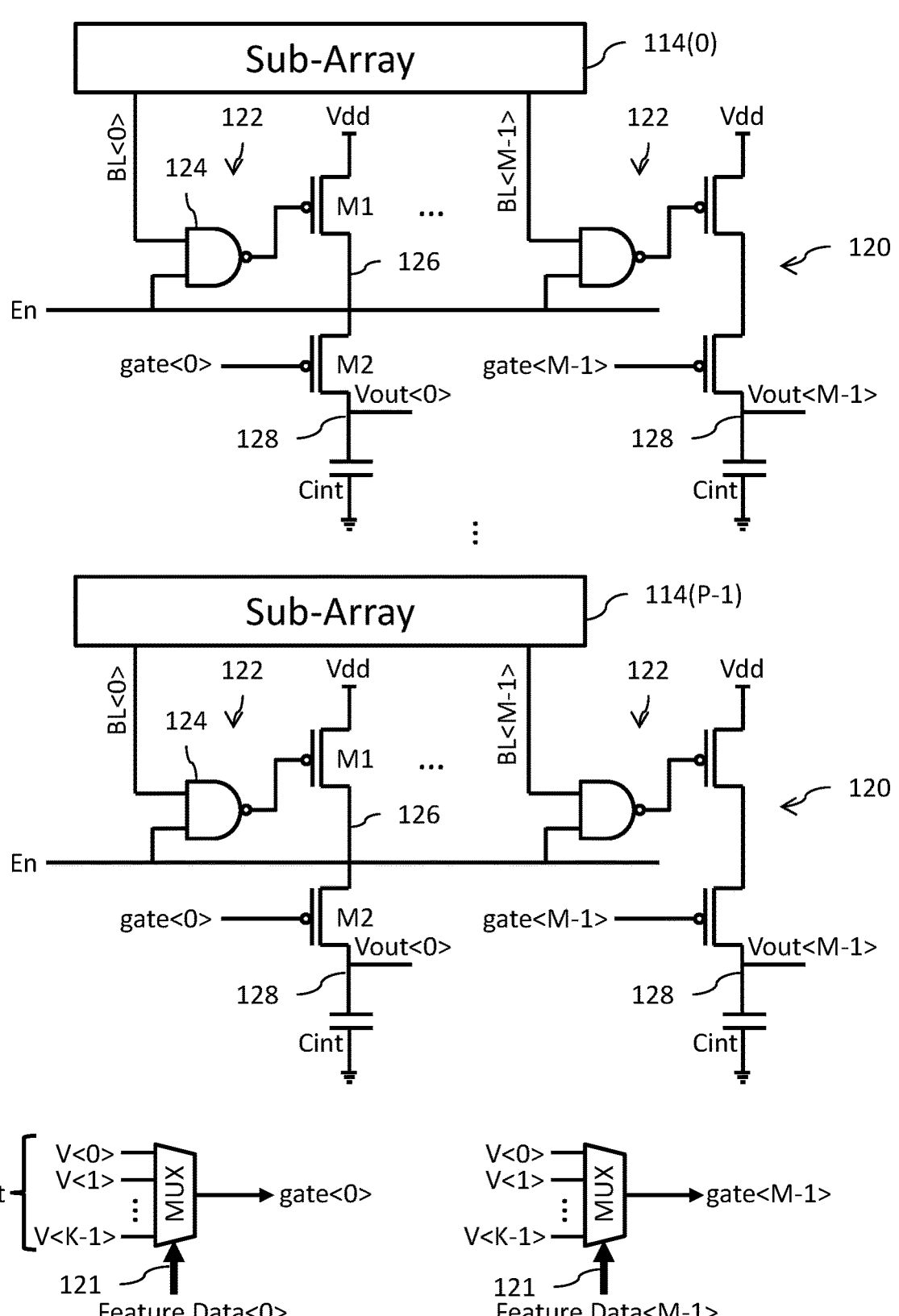
FIG. 7 shows an alternative embodiment of the computation tile for the circuit of FIG. 4.

Reference is now made to FIG. 7 which shows an alternative embodiment of the computation tile circuit 120. Each column compute circuit 122 includes a combinational logic circuit 124 configured to logically combine the weight data bit on the bit line BL with an enable signal En. In this embodiment, the combinational logic circuit 124 is formed by a logic NAND gate. The output of the combinational logic circuit 124 is asserted (in this case logic low) when both the weight data bit and the enable signal En are logic high. The enable signal En is asserted logic high when the in-memory compute operation is being executed. The output of the combinational logic circuit 124 drives the gate of a p-channel MOS transistor M1 having a source coupled, preferably directly connected, to a supply voltage node Vdd and a drain coupled, preferably directly connected to an intermediate node 126. The transistor M1 is configured to function as a switching circuit.

The column compute circuit 122 further includes a p-channel MOS transistor M2 having a source coupled, preferably directly connected, to the intermediate node 126 and a drain coupled, preferably directly connected, to an output node 128. An integration capacitor Cint has a first terminal coupled, preferably directly connected, to the output node 128 and a second terminal coupled, preferably directly connected, to a reference voltage node (for example, ground). To this point, the column compute circuit 122 is identical to that shown in FIG. 5.

It will be noted that in the embodiment of FIG. 5, each column compute circuit 122 includes the K:1 multiplexer circuit MUX whose output drives the gate of transistor M2. In the embodiment of FIG. 7, however, the K:1 multiplexer circuit MUX is shared by all column compute circuits 122 in a column. Thus, in this embodiment, output of the K:1 multiplexer circuit MUX for the column drives the gates of all transistors M2 in that same column. This is possible since the feature data applied to the column compute circuits 122 for a given column is the same. Thus, for all of the column compute circuits 122 in the computation tiles 120 associated with a first column (and bit line BL<0>), a single K:1 multiplexer circuit MUX for that first column has K inputs configured to receive a set (Vset) of analog voltages V<0> to V<K−1> and a selection input that receives J bits of the feature data (Feature Data<0>). The output (signal gate<0>) of the shared multiplexer circuit MUX is coupled, preferably directly connected, to drive the gate terminals of the MOS transistors M2. Likewise, for all of the column compute circuits 122 in the computation tiles 120 associated with a last column (and bit line BL<M−1>), a single K:1 multiplexer circuit MUX for that last column has K inputs configured to receive analog voltages V<0> to V<K−1> and a selection input that receives J bits of the feature data (Feature Data<M−1>). The output (signal gate<M−1>) of the shared multiplexer circuit MUX is coupled, preferably directly connected, to drive the gate terminals of the MOS transistors M2.

It will be noted that for sake of clarity in the FIG. 7 illustration, the switching circuits S, the global voltage lines and the ADC circuits have all been omitted. The configuration of these circuits is identical to that shown in FIG. 5.

Figure 8:
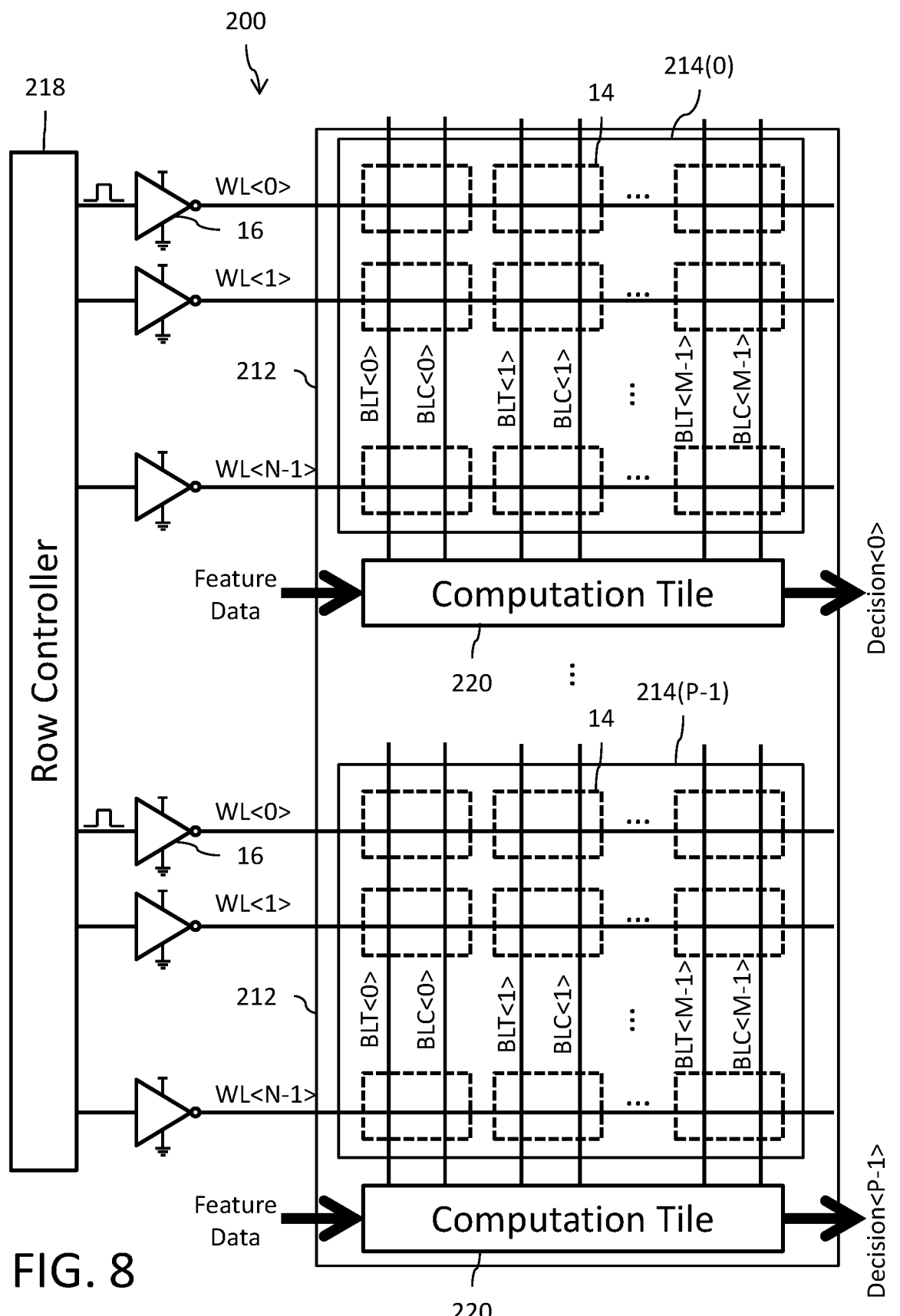
FIG. 8 is a schematic diagram of another embodiment for the in-memory computation circuit.

Reference is now made to FIG. 8 which shows a schematic diagram of another embodiment for the in-memory computation circuit 200. The circuit 200 utilizes a static random access memory (SRAM) array 212 that is segmented (i.e., partitioned) into a plurality of sub-arrays 214. In this example, there are P sub-arrays 214(0) to 214(P−1) within the array 212. Each sub-array 214(*i*), where i is the sub-array index from 0 to P−1, includes standard 6T SRAM memory cells 14 (see, FIG. 2) arranged in a matrix format having N rows and M columns. As an alternative, a standard 8T memory cell or an SRAM with a similar functionality and topology could instead be used. Each memory cell 14 is programmed to store a bit of a computational weight or kernel data for an in-memory compute operation. Each bit of the computational weight has either a logic "1" or a logic "0" value.

Each SRAM cell 14 includes a word line WL and a pair of complementary bit lines BLT and BLC. The 8T-type SRAM cell would additionally include a read word line RWL and a read bit line BLR. The cells 14 in a common row of each sub-array 114 are connected to each other through a common word line WL (and through the common read word line RWL in the 8T-type implementation). The cells 14 in a common column of each sub-array 214 are connected to each other through a common pair of complementary bit lines BLT and BLC (and through the common read bit line BLR in the 8T-type implementation). In the illustrated example, for a given sub-array 214(*i*) there is a true bit line BLT$_i$<j>, where j is a column index from 0 to M−1, coupled to the j-th column of memory cells 14, and there is a complement bit line BLC$_i$<j> coupled to that same j-th column of memory cells 14. Each word line WL, RWL is driven by a word line driver circuit 16 which may be implemented as a CMOS driver circuit (for example, a series connected p-channel and n-channel MOSFET transistor pair forming a logic inverter circuit). In the illustrated example, for a given sub-array 214(*i*), there is a word line WL<k>, where k is a row index from 0 to N−1, coupled to the k-th row of memory cells 14.

The memory cells 14 in a row are programmed to store M bits of multi-bit weight data for an in-memory compute operation (where the least significant bit of the multi-bit weight data is stored in the memory cell 14 for the first column with bit lines BLT<0>, BLC<0> and the most significant bit of the multi-bit weight data is stored in the memory cell 14 for the last column with bit lines BLT<M−1>, BLC<M−1>). Each bit of the computational weight has either a logic "1" or a logic "0" value. It will be noted that this arrangement for the storage of the multi-bit weight data is different from the implementation discussed previously where the N bits of multi-bit weight data for the in-memory compute operation were stored in the memory cells 14 of a column.

The word line signals applied to the word lines, and driven by the word line driver circuits 16, are generated from feature data input to the in-memory computation circuit 200 and controlled by a row controller circuit 218. In response to the feature data, the row controller circuit 218 selects the word line WL for one row at a time in each sub-array 214 in connection with the execution of a given in-memory compute operation and applies a pulsed word line signal to that selected word line. The pulsed word line signals on the asserted individual word lines in the different sub-arrays 214 have a fixed pulse pulse. In a preferred embodiment, the width of the word line signal pulse is selected so that a full swing on the bit line BL is achieved when reading the bit of the weight data from the memory cell 14 (i.e., one of the complementary bit lines BLT or BLC will be fully discharge). Thus, in response to the assertion of the word line signal, and as a function of the logic state of the weight bit stored in the accessed memory cell 14, local bit line voltages VL develop on the complementary bit lines BLT and BLC.

FIG. 8 illustrates an example where the first word lines WL<0> in each of the plurality of sub-arrays 214 are being simultaneously driven by fixed pulse width word line signals through the word line driver circuits 16 in response to the feature data for the in-memory compute operation. In an embodiment, the row controller circuit 218 may sequentially select each of the word lines WL<0> through WL<N−1> in connection with executing the in-memory compute operation. In any case, it is preferable that only one word line (not necessarily the same word line) at a time per sub-array 214 be asserted in order to minimize the risk of inadvertent bit flip within each sub-array 214 during the in-memory compute operation.

A computation tile circuit 220 for each sub-array 214 receives the logic state on one of the complementary bit lines BLT and BLC (and/or on the read bit line BLR) for each of the M columns. That bit line logic state corresponds to the logic state of one bit of the multi-bit weight data stored in the memory cell 14 which is accessed by the asserted word line signal pulse. The computation tile circuit 220 further receives the feature data for the in-memory compute operation from a feature data bus. A current digital-to-analog converter (I-DAC) circuit converts the digital feature data to an analog current that is selectively integrated as a function of the sensed logic state of the memory cell 14 to generate a column output voltage. The column output voltages are averaged and the averaged voltage is sampled and converted by an analog-to-digital converter (ADC) circuit to produce a decision output from the computation tile 220. The in-memory compute operation being performed is essentially a dot-product operation of the feature data and the multi-bit weight data. The decision outputs Decision<0> through Decision<P−1> may be individually used or further combined in a subsequent digital signal processing (DSP) operation.

Although not explicitly shown in FIG. 8, it will be understood that the circuit 200 further includes conventional row decode, column decode, and read-write circuits known to those skilled in the art for use in connection with writing bits of the computational weight to, and reading bits of the computational weight from, the SRAM cells 14 of each sub-array 214 within the memory array 212.

Figures 9, 10:
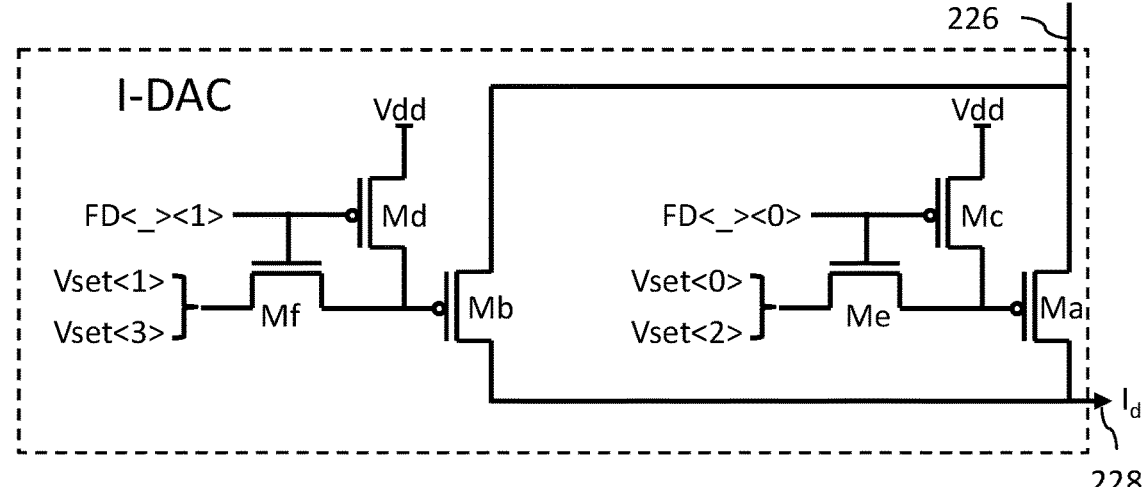
FIG. 9 is a circuit diagram for an embodiment of a computation tile used in the circuit of FIG. 8.
FIG. 10 is circuit diagram for an embodiment of a current digital-to-analog converter (I-DAC circuit) used in the circuit of FIG. 9.

Reference is now made to FIG. 9 which illustrates a circuit diagram for an embodiment of the computation tile 220. The computation tile 220 includes a column compute circuit 222 connected to the bit line BL (either BLT or BLC) of a corresponding column of the sub-array 214. Each column compute circuit 222 includes a combinational logic circuit 224 configured to logically combine the weight data bit on the bit line BL with an enable signal En.

In this embodiment, the combinational logic circuit 224 is formed by a logic NAND gate. The output of the combinational logic circuit 224 is asserted (in this case logic low) when both the weight data bit and the enable signal En are logic high. The enable signal En is asserted logic high when the in-memory compute operation is being executed. The output of the combinational logic circuit 224 drives the gate of a p-channel MOS transistor M1 having a source coupled, preferably directly connected, to a supply voltage node Vdd and a drain coupled, preferably directly connected, to an intermediate node 226. The transistor M1 is configured to function as a switching circuit. The combinational logic circuit 224 and transistor M1 form a switched timing circuit where transistor M1 is turned on to provide the supply voltage Vdd at intermediate node 226 for a duration of time equal to the width of the enable signal En if the bit line BL is at logic 1.

Each column compute circuit 222 further includes a current digital-to-analog converter (I-DAC) circuit coupled, preferably directly connected, to receive power from the intermediate node 226. The I-DAC circuit receives a set of analog voltages Vset and the bits of the feature data. The I-DAC circuit decodes the bits of the feature data to select one (or more) of the voltages from the set of voltages Vset for use in generating the output drain current $I_d$.

The output drain currents from the I-DAC circuits are applied to an output node 228 coupled, preferably directly connected, to a first terminal of an integration capacitor Cint. A second terminal of the integration capacitor Cint is coupled, preferably directly connected, to a reference voltage node (for example, ground). The integration capacitor Cint integrates the drain currents $I_d$ to generate an output voltage Vout at the output node 228. The integration time for the generated drain current(s) $I_d$ is controlled by the width of the enable signal En pulse.

The output node 228 is selectively connected through a switch S<0> to a global output line 230 that is coupled, preferably directly connected, to the input of an analog-to-digital converter (ADC) circuit 232. The ADC circuit 232 functions to sample and convert the voltage Vglobal on the global output line 230 to generate the digital decision output for the column compute circuit 222. The global output line 230 may, in some embodiments extend parallel to rows of the sub-array, and in other embodiments extend parallel to columns of the sub-arrays.

The set of analog voltages Vset received by each I-DAC circuit in this embodiment where the weight data is multi-bit are different. For example, the I-DAC circuit coupled to the first column associated with bit line BL<0> receives a first set of analog voltages Vset(0), and the I-DAC circuit coupled to the last column associated with bit line BL<M−1> receives an (M−1)th set of analog voltages Vset(M−1). There is a binary weighted relationship between the sets of analog voltages Vset(0) to Vset(M−1) provided to the I-DAC circuits.

The following table illustrates operation of the computation tile 220 including two column compute circuit 222 in an example with a two bit weight (i.e., M=2) and two bit feature data:

| Feature Data | | Weight | | Drain Current | Output Voltage |
|---|---|---|---|---|---|
| 1 | 1 | 1 | 1 | 9*Iref | 9*ΔV |
| 1 | 0 | | | 6*Iref | 6*ΔV |
| 0 | 1 | | | 3*Iref | 3*ΔV |
| 0 | 0 | | | 0 | 0 |
| 1 | 1 | 1 | 0 | 6*Iref | 6*ΔV |
| 1 | 0 | | | 4*Iref | 4*ΔV |
| 0 | 1 | | | 2*Iref | 2*ΔV |
| 0 | 0 | | | 0 | 0 |
| 1 | 1 | 0 | 1 | 3*Iref | 3*ΔV |
| 1 | 0 | | | 2*Iref | 2*ΔV |
| 0 | 1 | | | 1*Iref | 1*ΔV |
| 0 | 0 | | | 0 | 0 |
| 1 | 1 | 0 | 0 | 0 | 0 |

-continued

| Feature Data | Weight | Drain Current | Output Voltage |
|---|---|---|---|
| 1 | 0 | 0 | 0 |
| 0 | 1 | 0 | 0 |
| 0 | 0 | 0 | 0 |

Those skilled in the art will recognize that the foregoing can be extended to any desired number of bits for the weight and any desired number of bits for the feature data.

Reference is now made to FIG. 10 which shows an embodiment for the I-DAC circuit used in the column compute circuit 222 of FIG. 9. In this example implementation, the I-DAC circuit is configured for operation with two bit feature data (FD<_> <1:0>). A p-channel MOS transistor Ma has a source coupled, preferably directly connected, to the intermediate node 226 and a drain coupled, preferably directly connected, to the output node 228. A p-channel MOS transistor Mb has a source coupled, preferably directly connected, to the intermediate node 226 and a drain coupled, preferably directly connected, to the output node 228. A p-channel MOS transistor Mc has a source coupled, preferably directly connected, to the supply voltage node Vdd and a drain coupled, preferably directly connected, to the gate of transistor Ma. The gate of the transistor Mc receives the less significant bit of the feature data FD<_> <0>. A p-channel MOS transistor Md has a source coupled, preferably directly connected, to the supply voltage node Vdd and a drain coupled, preferably directly connected, to the gate of transistor Mb. The gate of the transistor Md receives the more significant bit of the feature data FD<_> <1>. An n-channel MOS transistor Me has a drain coupled, preferably directly connected, to the gate of transistor Ma and a source coupled, preferably directly connected, to receive one of the voltages in the set of voltages Vset. The gate of the transistor Me receives the less significant bit of the feature data FD<_> <0>. An n-channel MOS transistor Mf has a drain coupled, preferably directly connected, to the gate of transistor Mb and a source coupled, preferably directly connected, to receive another of the voltages in the set of voltages Vset. The gate of the transistor Mf receives the more significant bit of the feature data FD<_> <1>.

For the I-DAC circuit that is coupled to the first column associated with bit line BL<0>, the first set of analog voltages Vset(0) includes the voltages Vset<0> and Vset<1> applied to the sources of transistors Me and Mf, respectively. For the I-DAC circuit that is coupled to the second column associated with bit line BL<1>, the second set of analog voltages Vset(1) includes the voltages Vset<2> and Vset<3> applied to the sources of transistors Me and Mf, respectively. There is a binary weighting relationship between the voltages Vset<0> and Vset<1> of Vset(0) and the voltages Vset<2> and Vset<3> of Vset(1).

Operation of the I-DAC circuit is as follows: Assume first that both bits of the two bit feature data (FD<_> <1:0>) are logic 0. In this case, transistors Mc and Md will both be turned on to apply Vdd to the gates of transistors Ma and Mb. As a result, transistors Ma and Mb will both be turned off and the drain currents $I_d$ will be zero (regardless of the logic state of the weight bit or the pulse of the enable signal En). It will be noted from the previous table that when both bits of the feature data are logic 0 there is no drain current output and the change in voltage integrated on the capacitor Cint is zero.

Now, assume that the less significant bit of the two bit feature data (FD<_> <1:0>) is logic 1 and the more significant bit of the two bit feature data (FD<_> <1:0>) is logic 0. In this case, transistor Mc is turned off and transistor Md is turned on. As a result, transistor Mb is also turned off and will not contribute a drain current to the output. However, transistor Ma can contribute a drain current dependent on two factors: a) the voltage at the gate of transistor Ma and b) whether the memory cell on the bit line is storing a logic 1 value for the bit of the weight data. The logic 1 state of the less significant bit of the two bit feature data (FD<_> <1:0>) will cause transistor Me to turn on and the analog voltage Vset<0> or Vset<2> will be applied to the gate of transistor Ma to be converted by the transconductance of transistor Ma to a non-zero drain current.

For the case where the less significant bit of the two bit weight data is logic 1 and the more significant bit of the two bit weight data is logic 0, only the transconductance from the analog voltage Vset<0> contributes to the drain current (which is applied for the duration of the pulse width of the enable signal En if the weight bit on the bit line is logic 1). This is shown in the previous table with the drain current 1*Iref and the resulting change in voltage integrated on the integration capacitor Cint of 1*ΔV.

For the case where the less significant bit of the two bit weight data is logic 0 and the more significant bit of the two bit weight data is logic 1, only the transconductance from the analog voltage Vset<2> contributes to the drain current (which is applied for the duration of the pulse width of the enable signal En if the weight bit on the bit line is logic 1). This is shown in the previous table with the drain current 2*Iref and the resulting change in voltage integrated on the integration capacitor Cint of 2*ΔV.

For the case where both bits of the two bit weight data are logic 1, the transconductances from both the analog voltages Vset<0> and Vset<2> contribute to the drain current (which is applied for the duration of the pulse width of the enable signal En if the weight bit on the bit line is logic 1). This is shown in the previous table with the drain current 3*Iref and the resulting change in integrated voltage on the integration capacitor Cint of 3*ΔV.

Now, assume that the less significant bit of the two bit feature data (FD<_> <1:0>) is logic 0 and the more significant bit of the two bit feature data (FD<_> <1:0>) is logic 1. In this case, transistor Md is turned off and transistor Mc is turned on. As a result, transistor Ma is also turned off and will not contribute a drain current to the output. However, transistor Mb can contribute a drain current dependent on two factors: a) the voltage at the gate of transistor Mb and b) whether the memory cell on the bit line is storing a logic 1 value for the bit of the weight data. The logic 1 state of the less significant bit of the two bit feature data (FD<_> <1:0>) will cause transistor Mf to turn on and the analog voltage Vset<1> or Vset<3> will be applied to the gate of transistor Mb to be converted by the transconductance of transistor Mb to a non-zero drain current.

For the case where the less significant bit of the two bit weight data is logic 1 and the more significant bit of the two bit weight data is logic 0, only the transconductance from the analog voltage Vset<1> contributes to the drain current (which is applied for the duration of the pulse width of the enable signal En if the weight bit on the bit line is logic 1). This is shown in the previous table with the drain current 2*Iref and the resulting change in integrated voltage on the integration capacitor Cint of 2*ΔV.

For the case where the less significant bit of the two bit weight data is logic 0 and the more significant bit of the two bit weight data is logic 1, only the transconductance from the analog voltage Vset<3> contributes to the drain current (which is applied for the duration of the pulse width of the enable signal En if the weight bit on the bit line is logic 1). This is shown in the previous table with the drain current 4*Iref and the resulting change in integrated voltage on the integration capacitor Cint of 4*ΔV.

For the case where both bits of the two bit weight data are logic 1, the transconductances from both the analog voltages Vset<1> and Vset<3> contribute to the drain current (which is applied for the duration of the pulse width of the enable signal En if the weight bit on the bit line is logic 1). This is shown in the previous table with the drain current 6*Iref and the resulting change in integrated voltage on the integration capacitor Cint of 6*ΔV.

Now, assume that both bits of the two bit feature data (FD<_> <1:0>) are logic 1. In this case, transistor Mc is turned off and transistor Md is turned off. As a result, transistors Ma and Mb can contribute a drain current dependent on two factors: a) the voltage at the gate of transistor Mb and b) whether the memory cell on the bit line is storing a logic 1 value for the bit of the weight data. The logic 1 state of the less significant bit of the two bit feature data (FD<_> <1:0>) will cause transistor Me to turn on and the analog voltage Vset<0> or Vset<2> will be applied to the gate of transistor Ma to be converted by the transconductance of transistor Ma to a non-zero drain current. The logic 1 state of the less significant bit of the two bit feature data (FD<_> <1:0>) will cause transistor Mf to turn on and the analog voltage Vset<1> or Vset<3> will be applied to the gate of transistor Mb to be converted by the transconductance of transistor Mb to a non-zero drain current.

For the case where the less significant bit of the two bit weight data is logic 1 and the more significant bit of the two bit weight data is logic 0, the transconductances from the analog voltages V<0> and Vset<2> contribute to the drain current (which is applied for the duration of the pulse width of the enable signal En if the weight bit on the bit line is logic 1). This is shown in the previous table with the drain current 3*Iref and the resulting change in integrated voltage on the integration capacitor Cint of 3*ΔV.

For the case where the less significant bit of the two bit weight data is logic 0 and the more significant bit of the two bit weight data is logic 1, the transconductances from the analog voltages Vset<1> and Vset<3> contributes to the drain current (which is applied for the duration of the pulse width of the enable signal En if the weight bit on the bit line is logic 1). This is shown in the previous table with the drain current 6*Iref and the resulting change in integrated voltage on the integration capacitor Cint of 6*ΔV.

For the case where both bits of the two bit weight data are logic 1, the transconductances from the analog voltages Vset<0>, Vset<1>, Vset<2> and Vset<3> contribute to the drain current (which is applied for the duration of the pulse width of the enable signal En if the weight bit on the bit line is logic 1). This is shown in the previous table with the drain current 9*Iref and the resulting change in integrated voltage on the integration capacitor Cint of 9*ΔV.

Figure 11:
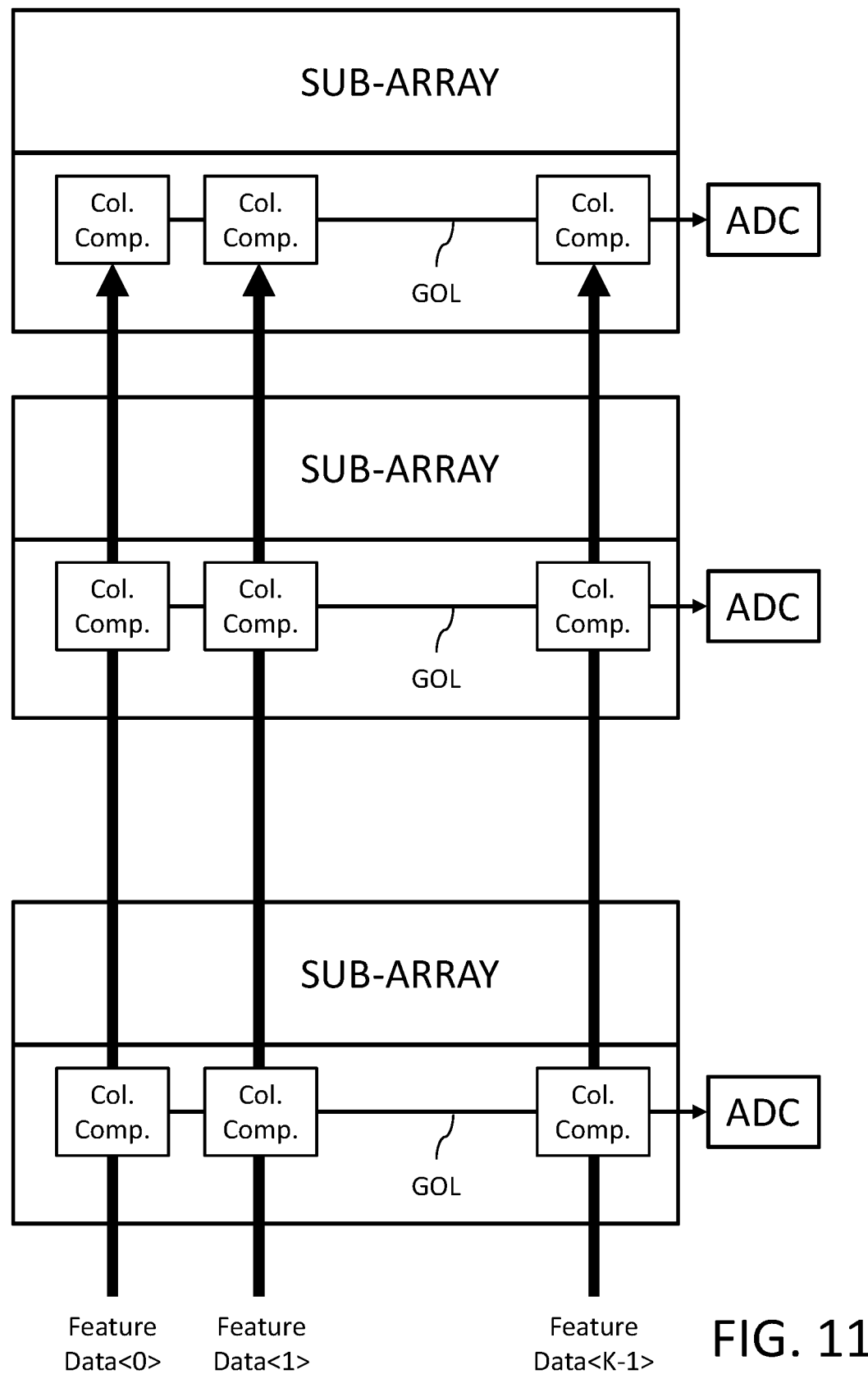
FIGS. 11-12 illustrate alternative architectures for the in-memory compute circuit.
Figure 12:
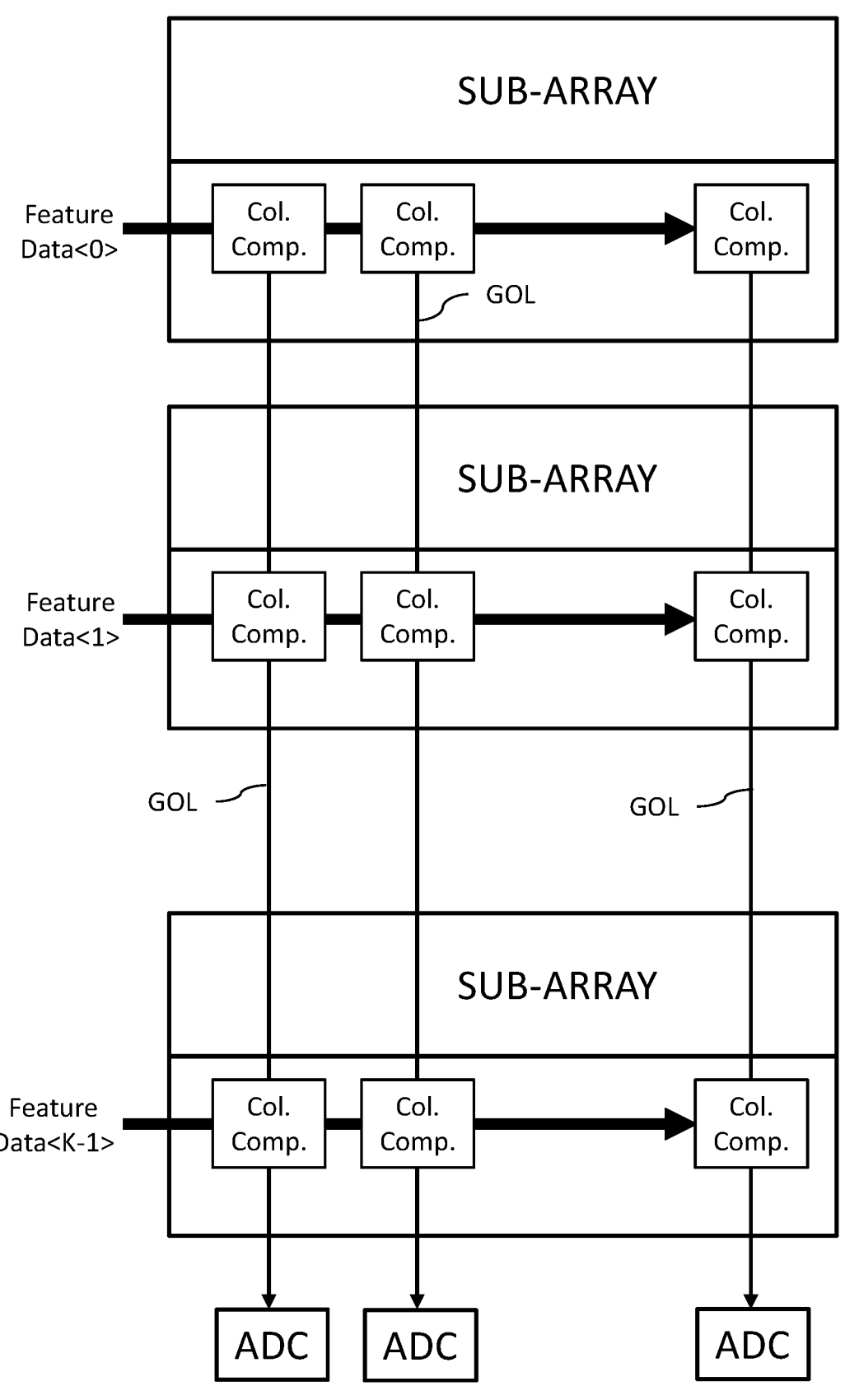

It will be noted that the architecture of the in-memory compute system can be designed to have the global output line GOL (reference 130, 230) extend in either the row direction or the column direction. FIG. 11 shows a layout for the sub-arrays and the column compute circuits for the computation tiles arranged with the global output lines GOL extending in the row direction (i.e., parallel to rows of the sub-arrays). The feature data in this implementation is applied to the column compute circuits in the column direction. FIG. 12 shows a layout for the sub-arrays and the column compute circuits for the computation tiles arranged with the global output lines GOL extending in the column direction (i.e., parallel to columns of the sub-arrays). The feature data in this implementation is applied to the column compute circuits in the row direction.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. An in-memory computation circuit, comprising:
   a memory array including a plurality of sub-arrays, wherein each sub-array includes memory cells arranged in a matrix with plural rows and plural columns, each row including a word line connected to the memory cells of the row, and each column including a bit line connected to the memory cells of the column, said memory cells configured to store bits of weight data for an in-memory compute operation;
   a word line driver circuit for each row having an output connected to drive the word line of the row;
   a row controller circuit configured to simultaneously actuate at least one word line for each sub-array for the in-memory compute operation by applying pulses through the word line driver circuits to the word lines; and
   a computation tile circuit for each sub-array, wherein each computation tile circuit includes a plurality of column compute circuits coupled to the bit lines, respectively, of the columns of the sub-array;
   wherein each column compute circuit comprises:
      a switched timing circuit that is actuated in response to a first logic state of the weight data on the bit line for a duration of time set by an enable signal for the in-memory compute operation;
      a current digital-to-analog converter (I-DAC) circuit powered by actuation of the switched timing circuit and configured to generate a drain current having a magnitude controlled by bits of feature data for the in-memory compute operation; and
      an integration circuit configured to integrate the drain current and generate an output signal;
   wherein the switched timing circuit comprises:
      a combinational logic circuit configured to logically combine the bit of the weight data on the bit line with the enable signal and generate a gate control signal; and
      a first MOS transistor having a source coupled to a power supply node, a gate configured to receive the gate control signal and a drain coupled to a power input of the I-DAC circuit;
   wherein the computation tile circuit for each sub-array further comprises:
      a global line;
      a switch selectively coupling the output signal from each computation tile circuit to the global line; and
      an analog-to-digital converter (ADC) circuit configured to sample and convert a voltage on the global line to generate a digital decision output for the in-memory compute operation; and
   wherein the global line extends parallel to columns of the sub-array.

2. The circuit of claim 1, wherein the pulses applied to the word lines for the in-memory compute operation all have a same pulse width.

3. The circuit of claim 1, wherein the row controller circuit is configured to simultaneously actuate only one word line at a time for each sub-array.

4. An in-memory computation circuit, comprising:

a memory array including a plurality of sub-arrays, wherein each sub-array includes memory cells arranged in a matrix with plural rows and plural columns, each row including a word line connected to the memory cells of the row, and each column including a bit line connected to the memory cells of the column, said memory cells configured to store bits of weight data for an in-memory compute operation;

a word line driver circuit for each row having an output connected to drive the word line of the row;

a row controller circuit configured to simultaneously actuate at least one word line for each sub-array for the in-memory compute operation by applying pulses through the word line driver circuits to the word lines; and a computation tile circuit for each sub-array, wherein each computation tile circuit includes a plurality of column compute circuits coupled to the bit lines, respectively, of the columns of the sub-array;

wherein each column compute circuit comprises:

a switched timing circuit that is actuated in response to a first logic state of the weight data on the bit line for a duration of time set by an enable signal for the in-memory compute operation;

a current digital-to-analog converter (I-DAC) circuit powered by actuation of the switched timing circuit and configured to generate a drain current having a magnitude controlled by bits of feature data for the in-memory compute operation; and an integration circuit configured to integrate the drain current and generate an output signal;

wherein the I-DAC circuit comprises:

a second MOS transistor having a source coupled to an output of the switched timing circuit, a gate configured to receive a gate voltage, and a drain configured to output the drain current; and a selection circuit configured to receive a plurality of voltages and select one voltage of the plurality of voltages as said gate voltage in response to a decoding of the feature data;

wherein said selection circuit comprises:

a third MOS transistor having a source coupled to a power supply node, a gate configured to receive a bit of the feature data and a drain coupled to the gate of the second MOS transistor; and a fourth MOS transistor having a source coupled to receive a voltage of the plurality of voltages, a gate configured to receive said bit of the feature data and a drain coupled to the gate of the second MOS transistor.

5. The circuit of claim 4, wherein said selection circuit comprises a multiplexer circuit having inputs to receive said plurality of voltages, an output coupled to the gate of the second MOS transistor and selection input configured to receive bits of the feature data.

6. The circuit of claim 4, wherein the weight data is multi-bit data, and wherein bits of the multi-bit data are stored in a column of memory cells of the sub-array.

7. The circuit of claim 6, wherein the row controller circuit is further configured to sequentially actuate one word line in each sub-array at a time for the in-memory compute operation, and wherein pulses of the enable signal for the sequential word line actuations have pulse widths with a binary weighting relationship.

8. The circuit of claim 7, wherein the integration circuit is configured to integrate drain currents generated in response the pulse widths of the enable signal to generate the output signal.

9. The circuit of claim 6, wherein the row controller circuit is further configured to sequentially actuate one word line in each sub-array at a time for the in-memory compute operation, and wherein pulses of the enable signal for the sequential word line actuations have a same pulse width.

10. The circuit of claim 9, wherein the integration circuit is configured to separately integrate the drain current generated in response each pulse of the enable signal to generate a plurality of the output signals.

11. The circuit of claim 4, wherein the pulses applied to the word lines for the in-memory compute operation all have a same pulse width.

12. The circuit of claim 4, wherein the row controller circuit is configured to simultaneously actuate only one word line at a time for each sub-array.

13. The circuit of claim 4, wherein the computation tile circuit for each sub-array further comprises:

a global line;

a switch selectively coupling the output signal from each computation tile circuit to the global line; and an analog-to-digital converter (ADC) circuit configured to sample and convert a voltage on the global line to generate a digital decision output for the in-memory compute operation.

14. An in-memory computation circuit, comprising:

a memory array including a plurality of sub-arrays, wherein each sub-array includes memory cells arranged in a matrix with plural rows and plural columns, each row including a word line connected to the memory cells of the row, and each column including a bit line connected to the memory cells of the column, said memory cells configured to store bits of weight data for an in-memory compute operation;

a word line driver circuit for each row having an output connected to drive the word line of the row;

a row controller circuit configured to simultaneously actuate at least one word line for each sub-array for the in-memory compute operation by applying pulses through the word line driver circuits to the word lines; and a computation tile circuit for each sub-array, wherein each computation tile circuit includes a plurality of column compute circuits coupled to the bit lines, respectively, of the columns of the sub-array;

wherein each column compute circuit comprises:

a switched timing circuit that is actuated in response to a first logic state of the weight data on the bit line for a duration of time set by an enable signal for the in-memory compute operation;

a current digital-to-analog converter (I-DAC) circuit powered by actuation of the switched timing circuit and configured to generate a drain current having a magnitude controlled by bits of feature data for the in-memory compute operation; and an integration circuit configured to integrate the drain current and generate an output signal;

wherein the I-DAC circuit comprises:

a second MOS transistor having a source coupled to an output of the switched timing circuit, a gate configured to receive a selected voltage, and a drain configured to output the drain current; and a selection circuit configured to receive a plurality of voltages and select one voltage of the plurality of voltages as said selected voltage in response to a decoding of the feature data;

wherein the weight data is multi-bit data, and wherein bits of the multi-bit data are stored in a row of memory cells of the sub-array and the same feature data is input to the selection circuits across the column compute circuits for the computation tile circuit.

15. The circuit of claim 14, wherein the plurality of voltages received by each selection circuit comprise a set of voltages and wherein the sets of voltages have a binary weighting relationship from selection circuit to selection circuit across the column compute circuits for the computation tile circuit.

16. The circuit of claim 15, wherein the integration circuit is shared by the column compute circuits.

17. The circuit of claim 14, wherein the pulses applied to the word lines for the in-memory compute operation all have a same pulse width.

18. The circuit of claim 14, wherein the row controller circuit is configured to simultaneously actuate only one word line at a time for each sub-array.

19. The circuit of claim 14, wherein the computation tile circuit for each sub-array further comprises:

a global line;

a switch selectively coupling the output signal from each computation tile circuit to the global line; and an analog-to-digital converter (ADC) circuit configured to sample and convert a voltage on the global line to generate a digital decision output for the in-memory compute operation.

\* \* \* \* \*